United States Patent
Rusu et al.

(10) Patent No.: US 7,144,521 B2
(45) Date of Patent: Dec. 5, 2006

(54) HIGH ASPECT RATIO ETCH USING MODULATION OF RF POWERS OF VARIOUS FREQUENCIES

(75) Inventors: Camelia Rusu, Fremont, CA (US); Rajinder Dhindsa, San Jose, CA (US); Eric A. Hudson, Berkeley, CA (US); Mukund Srinivasan, Fremont, CA (US); Lumin Li, Santa Clara, CA (US); Felix Kozakevich, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 351 days.

(21) Appl. No.: 10/737,022

(22) Filed: Dec. 15, 2003

(65) Prior Publication Data
US 2006/0118518 A1    Jun. 8, 2006

Related U.S. Application Data

(63) Continuation-in-part of application No. 10/645,665, filed on Aug. 22, 2003.

(51) Int. Cl.
*B44C 1/22*    (2006.01)
(52) U.S. Cl. ............... 216/67; 156/345; 216/54; 216/63; 216/71; 438/712; 438/734; 257/187; 257/213; 427/569; 427/579; 427/534
(58) Field of Classification Search ................ 438/712, 438/734; 216/54, 71; 156/345.1
See application file for complete search history.

(56) References Cited

U.S. PATENT DOCUMENTS

| | | | |
|---|---|---|---|
| 4,464,223 A * | 8/1984 | Gorin | ............ 438/729 |
| 5,626,716 A | 5/1997 | Bosch et al. | |
| 5,656,123 A | 8/1997 | Salimian et al. | |
| 5,716,485 A | 2/1998 | Salimian et al. | |
| 6,127,278 A | 10/2000 | Wang et al. | |
| 6,303,510 B1 | 10/2001 | Chien et al. | |
| 6,387,287 B1 | 5/2002 | Hung et al. | |
| 6,433,297 B1 | 8/2002 | Kojima et al. | |
| 6,506,674 B1 | 1/2003 | Ikeda et al. | |
| 2004/0221958 A1* | 11/2004 | Loewenhardt et al. . | 156/345.47 |

OTHER PUBLICATIONS

S. Wolf, Silicon Processing for the VLSI Era, Lattice Press (1986), pp. 575, 547, 549.*
International Search Report, dated Feb. 8, 2005.

* cited by examiner

*Primary Examiner*—Nadine Norton
*Assistant Examiner*—Maki Angadi
(74) *Attorney, Agent, or Firm*—Beyer Weaver & Thomas LLP

(57) ABSTRACT

A method for etching a high aspect ratio feature through a mask into a layer to be etched over a substrate is provided. The substrate is placed in a process chamber, which is able to provide RF power at a first frequency, a second frequency different than the first frequency, and a third frequency different than the first and second frequency. An etchant gas is provided to the process chamber. A first etch step is provided, where the first frequency, the second frequency, and the third frequency are at power settings for the first etch step. A second etch step is provided, where the first frequency, the second frequency, and the third frequency are at a different power setting.

15 Claims, 11 Drawing Sheets

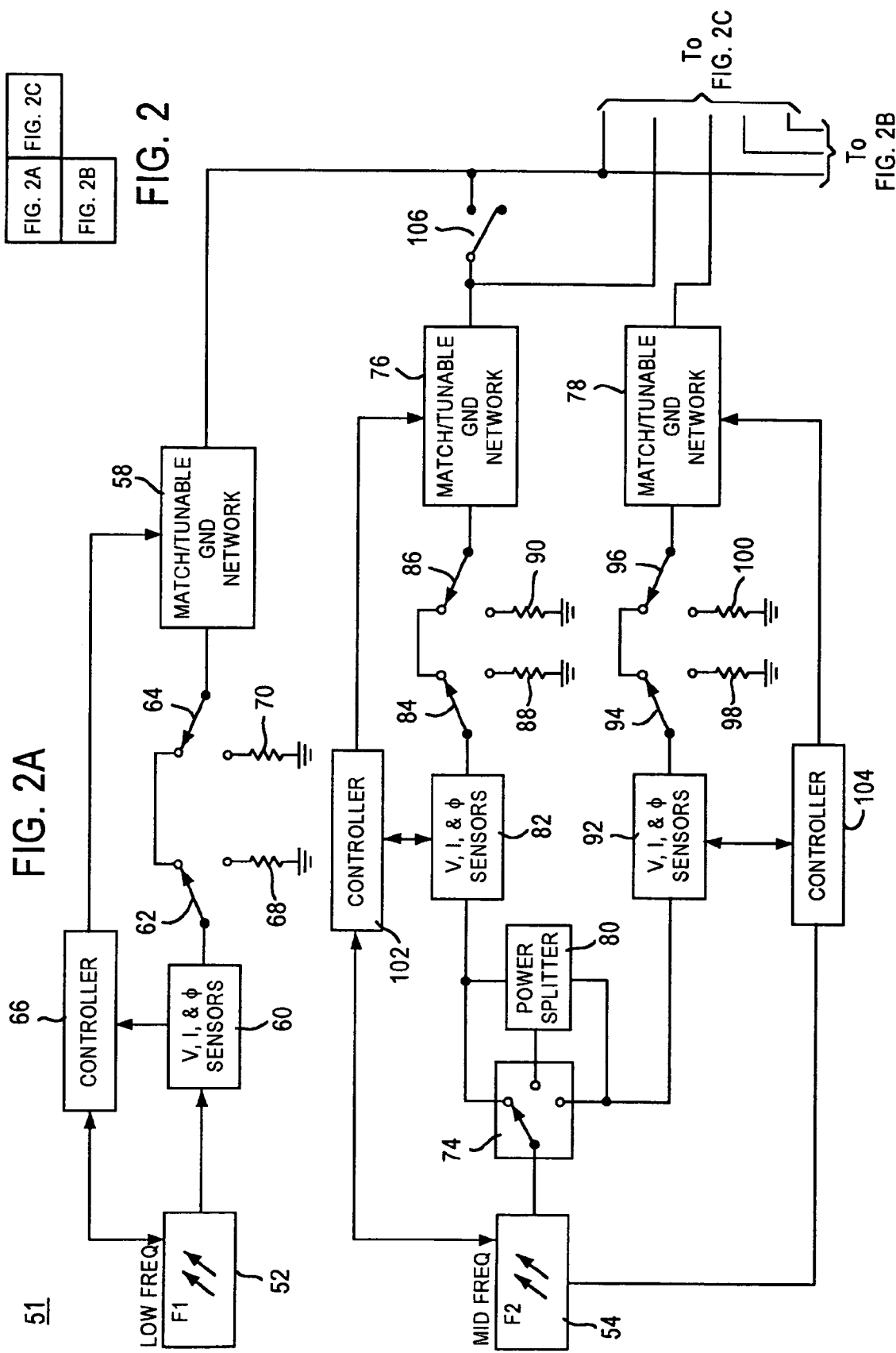

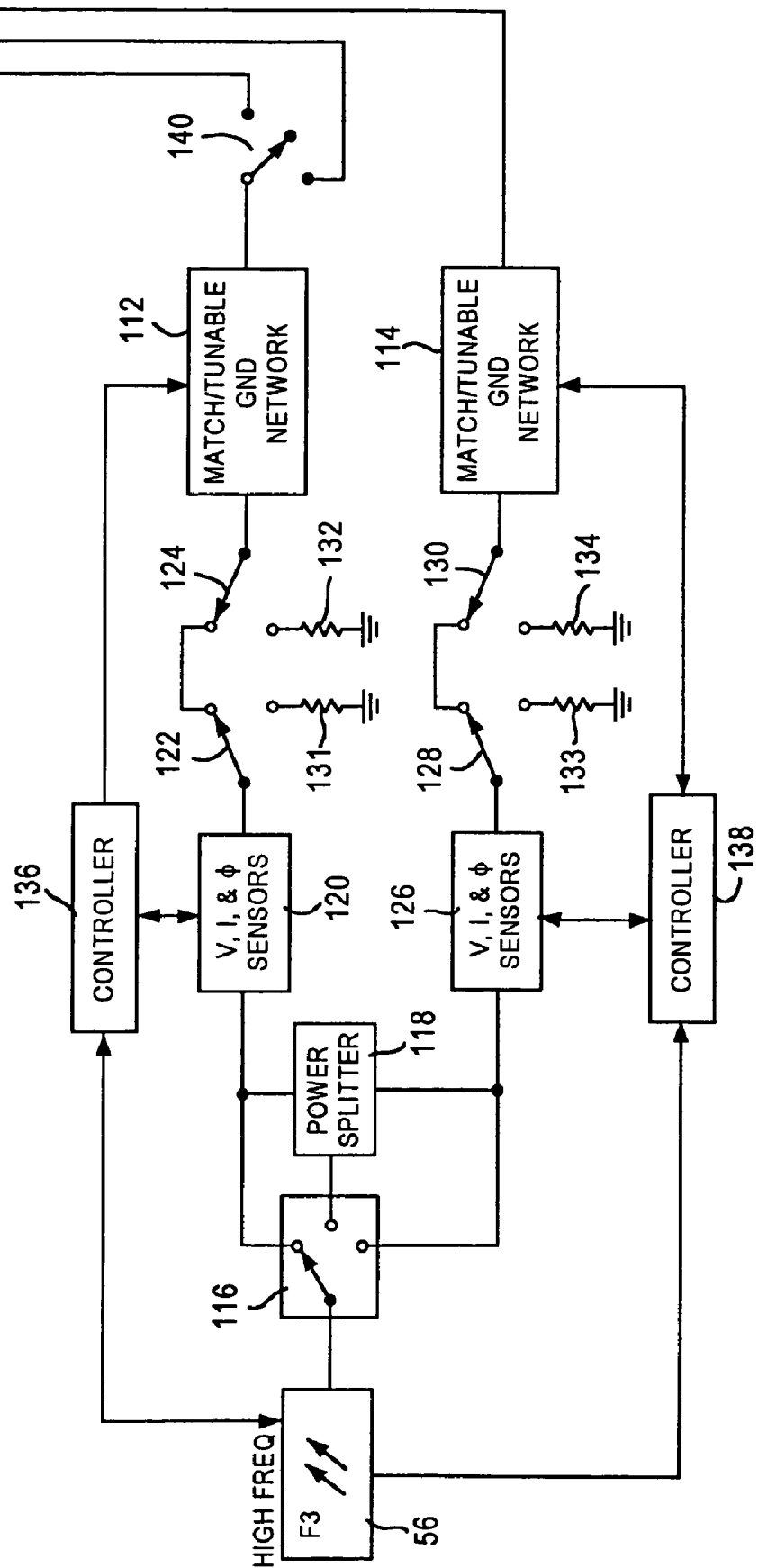

HIGH ASPECT RATIO ETCH USING MODULATION OF RF POWERS OF VARIOUS FREQUENCIES

RELATED APPLICATIONS

This application is a continuation-in-part of U.S. patent application No. 10/645,665 entitled "Multiple Frequency Plasma Etch Reactor" by Raj Dhindsa, Eric Lenz, Mukund Srinivasan, Aaron Eppler, Felix Kozakevich, Camelia Rusu, Lumin Li, Reza Sadjadi, Jim Tietz, and Jeff Marks filed Aug. 22, 2003, which is incorporated by reference in its entirety.

BACKGROUND OF THE INVENTION

1. Field of the Invention

The invention relates to a method for etching features, such as high aspect ratio features, into an etch layer.

2. Description of the Related Art

The present invention relates to the formation of semiconductor devices.

It is known to apply plasma excitation fields at two different frequencies to a region of a vacuum chamber for plasma processing a workpiece, wherein the region is coupled to a gas that the fields convert into the processing plasma. The workpiece is usually a semiconductor wafer, or dielectric plate and the plasma is involved in forming integrated circuit features on the workpiece. Typically, the plasma excitation fields at the two different frequencies are supplied to the region by a pair of spaced electrodes in the chamber or one electrode in the chamber and a reactance, in the form of a coil, located outside the chamber. The excited plasma typically dry etches the workpiece, but in some instances results in materials being deposited on the workpiece. High frequency RF power (having a frequency in excess of approximately 10 MHz) typically controls the density of the plasma, i.e., the plasma flux, while RF power having a low to medium frequency (in the range of 100 kHz to approximately 10 MHz) typically controls the energy of ions in the plasma and incident on the workpiece.

As the size of the features continues to decrease, there are increased requirements for precise control of various parameters of the plasma processing a workpiece. Amongst the plasma parameters requiring precise control are the plasma chemistry (i.e., types of ionic and radical species), the plasma flux and the ion energy of the plasma incident on the substrate. With the shrinking feature sizes and use of new materials in fabrication of integrated circuits, windows involved in processing the workpiece are decreasing in size, while pushing the limits on presently available plasma processors, particularly processors for etching. The shrinking feature sizes and requirements for new materials limit the use of the same reactor, i.e., vacuum processing chamber, for different etch applications.

High-aspect ratio (HAR) openings have a high opening depth to opening diameter ratio. A mask, such as a photoresist mask or a hard mask, is used to provide an opening pattern. In the specification and claims, a high aspect ratio feature is defined as a feature with a depth to diameter ratio greater than 10:1.

As the integrated circuit dimensions shrinks, the CDs and profile control along with the etch stop in high aspect ratio contact hole etching becomes very challenging problem in dielectric etch. The various features (top and bottom CD, profile angle, bowing and necking) of the contact/via hole depend upon plasma properties (e.g. plasma chemistry, ions to neutral flux, ion energy distribution etc.) and substrate properties (doping level of the dielectric material, temperature of the substrate etc.). However, for the same substrate properties, the plasma properties vary ( the ion to neutral ratio, the total flux etc.) as the high aspect ratio contact etching progresses. This causes a lower etch rate as the aspect ratio of the holes increases that leads to either etch stop or taper profile etc. Thus, the etching conditions has to be tailored to the etch depth and required profile providing an improved etch.

SUMMARY OF THE INVENTION

To achieve the foregoing and in accordance with the purpose of the present invention, a method for etching a high aspect ratio feature through a mask into a layer to be etched over a substrate is provided. The substrate is placed in a process chamber, which is able to provide RF power at a first frequency, a second frequency different than the first frequency, and a third frequency different than the first and second frequency. An etchant gas is provided to the process chamber. A first etch step is provided, where the first frequency is at a first power level, the second frequency is at a second power level, and the third frequency is at a third power level, where at least two of the three powers are greater than zero, where the first etch etches a feature in the layer to be etched to a first depth. A second etch step is provided, where the first frequency is at a fourth power level, the second frequency is at a fifth power level, and the third frequency is at a sixth power level, wherein at least one of the fourth and sixth powers is greater than zero and the fifth power is greater than zero, and where a condition is selected from the group of the first power not being equal to the fourth power or the third power not being equal to the sixth power, where the second etch etches the feature in the layer to be etched to a second depth greater than the first depth.

In another manifestation of the invention, an apparatus for etching a feature in an etch layer through a mask over a substrate is provided. A plasma processing chamber comprises a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure. A gas source is in fluid connection with the gas inlet. A first power source provides power within the chamber wall at a first frequency. A second power source provides power within the chamber wall at a second frequency different than the first frequency. A third power source provides power within the chamber wall at a third frequency different than the first frequency and the second frequency. A controller is controllably connected to the gas inlet, the first power source, the second power source, and the third power source. The controller comprises at least one processor and computer readable media, which comprises computer readable code for introducing an etchant gas through the gas inlet, computer readable code for performing a first etch step and computer readable code for providing a second etch step. The first etch step comprises providing energy from the first power source at a first power level, providing energy from the second power source at a second power level, and providing energy from the third power source at a third power level, wherein in the first power level and the third power level are greater than zero, wherein the first etch is used to etch a feature in the layer to be etched to a first depth. Computer readable code for performing a second etch step, comprises providing energy from the first power source at a fourth power level, providing energy from the second power source at a fifth power level, and providing energy from the third power source at a sixth power level, wherein in the first power level and the third power level are greater than zero, wherein the first etch is used to etch a feature in the layer to be etched to a first depth, wherein at least one of the fourth and sixth power levels is greater than zero and the fifth power level is greater than zero, and wherein a condition is selected from the group of the first power level not being equal to the fourth power level or the third power level not being equal to the sixth power level, wherein the second etch etches the feature in the layer to be etched to a second depth greater than the first depth.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 2A–C form a block diagram of the electronic circuitry included in the controller of FIG. 1 in combination with a schematic representation of the electric parts of the vacuum processor chamber illustrated in FIG. 1.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
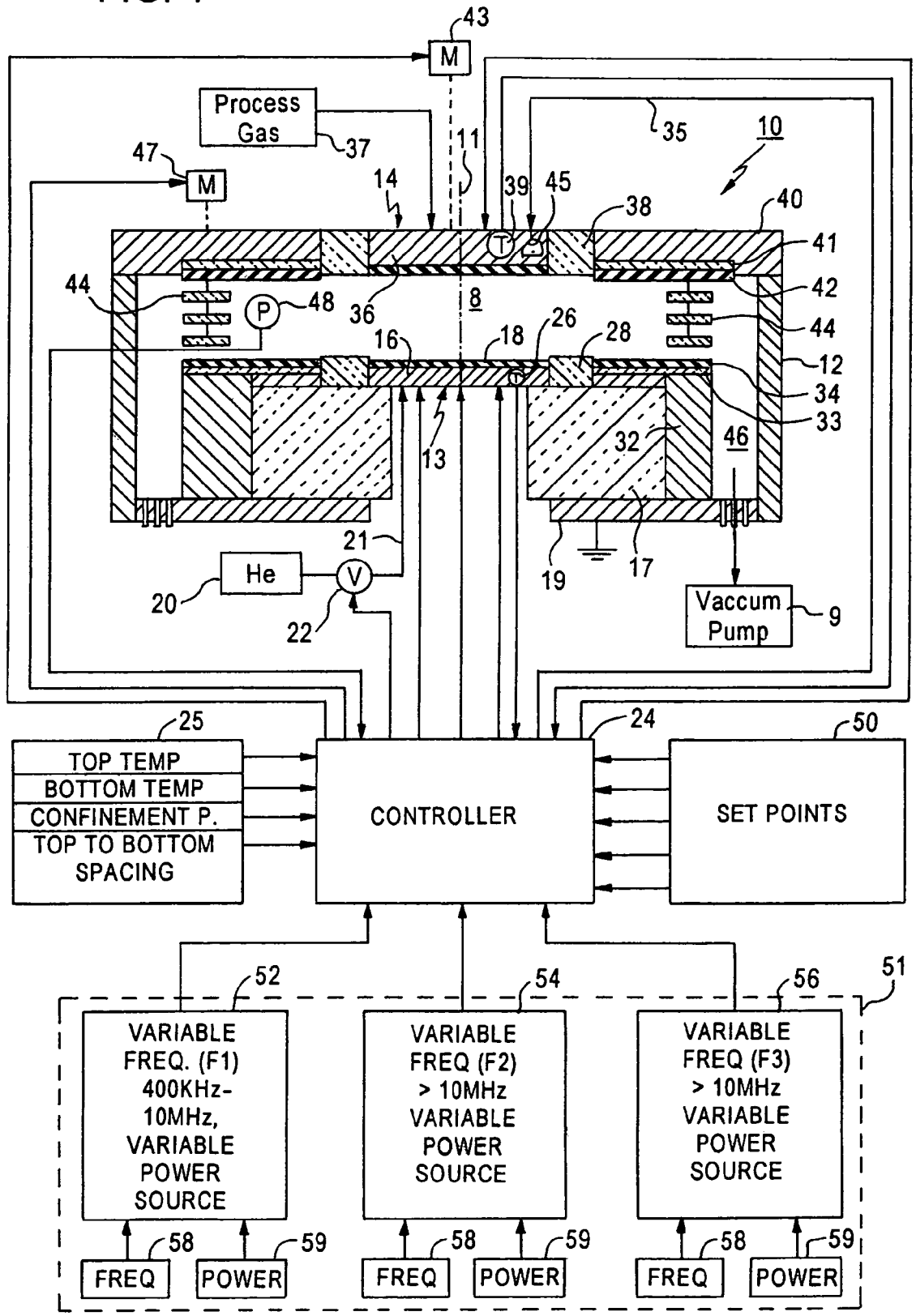
FIG. 1 is a partially schematic diagram of a vacuum plasma processor in accordance with a preferred embodiment of the present invention.

Reference is now made to FIG. 1 of the drawing wherein plasma processor vacuum chamber 10, having longitudinal axis (i.e., centerline) 11 is illustrated as including electrically conductive metal wall 12, bottom electrode assembly 13 and top electrode assembly 14. Wall 12 has a circular inner periphery, coaxial with axis 11. Wall 12 is grounded, i.e., at DC and RF reference potentials. Vacuum pump 9 maintains the interior of chamber 10 at a vacuum on the order of 0.001 to 500 torr during processing. The interior of chamber 10 includes confined plasma region 8 between a bottom boundary close to the top face of bottom electrode assembly 13 and a top boundary close to the bottom face of top electrode assembly 14; the side boundary of confined plasma region 8 is spaced from wall 12.

Bottom electrode assembly 13, frequently referred to as a bottom electrode, is coaxial with axis 11 and is secured to electric insulating ring 17, which in turn is secured to metal, grounded base 19 of chamber 10. Electrode assembly 13 includes circular, central metal electrode 16 that is coaxial with axis 11 and has an upper surface for receiving a circular workpiece 18, typically a semiconductor wafer having a diameter substantially equal to the diameter of metal electrode 16. When workpiece 18 is properly in place, its center is coincident with axis 11. Electrode 16 can be connected to a DC chucking voltage source (not shown) for clamping workpiece 18 to electrode 16 using electrostatic forces. The temperature of electrode 16 and workpiece 18 are controlled in a manner known to those skilled in the art by connecting helium source 20 to a region (not shown) in electrode 16 by way of conduit 21 and valve 22, responsive to an electric signal that controller 24 derives in response to (1) a temperature set point supplied to the controller by set point source 25 and (2) a measure of the temperature in the electrode, as indicated by a signal derived by temperature monitor 26 embedded in electrode 16.

Bottom electrode assembly 13 also includes electric insulator ring 28, typically made of quartz. Ring 28 is secured to the top face of insulator ring 17, is coaxial with axis 11 and has an inner diameter substantially equal to the diameter of workpiece 18 so that the periphery of workpiece 18, when the workpiece is properly in place, almost abuts the inner periphery of ring 28. The portion of the top face of ring 17 outside ring 28 and the side wall of ring 17 are covered by insulator ring 33 and grounded metal ring 32, respectively. Insulating ring 33 is overlaid by metal electrode ring 34 that can be covered or coated with a layer (not shown) of dielectric or conductive material. Electrically conductive ring 34 and the layer that covers or coats it are made of a material that does not contaminate the chemistry of the plasma in region 8. Such a material is a suitable relatively high conductivity semiconductor, e.g., intrinsic silicon. Alternatively, ring 34 is a metal covered by a suitable non-contaminating material. Ring 34 is electrically insulated from grounded metal ring 32 by dielectric, insulating ring 33 under certain circumstances and electrically connected to grounded ring 32 under other circumstances. Rings 33 and 34 are coaxial with axis 11, and extend horizontally between the outer edge of bottom electrode assembly 13 and ring 28.

Top electrode assembly 14 includes central electrode 36, coaxial with axis 11 and having a bottom face 36a made of electrically conductive intrinsic silicon that does not contaminate the chemistry of the plasma in region 8. Electrode 36 includes internal passages (not shown) and numerous showerhead openings (not shown), both connected in fluid flow relation to a suitable source 37 of process gases that flow through the showerhead openings into region 8 where the gases are converted into a plasma that processes workpiece 18. Electrode 36 includes a heating and/or cooling arrangement 45 responsive to an electric signal that controller 24 supplies to arrangement 45 via lead 35 in response to a set point signal supplied to the controller by set point source 25, as well as a signal indicative of the temperature of electrode 36, as derived by temperature gauge 39, embedded in assembly 14.

Assembly 14 also includes insulator ring 38 and metal ring 40. Ring 38 is coaxial with axis 11, preferably made of quartz and approximately aligned with ring 28. Ring 38 has an inner periphery abutting the outer periphery of central electrode 36. Metal ring 40, coaxial with axis 11, has inner and outer peripheries respectively abutting the outer periphery of insulator ring 38 and the inner periphery of side wall 12 so that ring 40 is at RF and DC ground potential. The lower, inner face of metal ring 40 is covered by electrical insulating ring 41 that carries an electrically conductive electrode ring 42. Electrode ring 42 is either coated or covered with a layer (not shown) of conductive or insulating material that does not contaminate the chemistry of the plasma in region 8. Ring 42 is electrically insulated from ring 40 and wall 12 by ring 41 and a downwardly depending flange (not shown) of ring 41 under certain circumstances and is electrically connected to ring 40 and wall 12 under other circumstances.

From the foregoing, confined plasma region 8 has a top boundary determined by (1) the bottom face 36a of electrode 36, (2) the bottom face of insulator ring 38 and (3) the bottom face of electrode ring 42, and a bottom boundary determined (1) by the top face of workpiece 18 (when the workpiece is in place), (2) the top face of insulator ring 28 and (3) the top face of electrode ring 34. Motor 43 controls the spacing between the top and bottom boundaries of region 8 by moving the bottom face of top electrode assembly 14 up-and-down relative to the top face of bottom electrode assembly 13. Motor 43 responds to a signal from controller 24 to set the spacing between the faces of electrode assemblies 13 and 14 at an experimentally determined optimum value for the particular frequencies that excite the plasma processing of workpiece 18, as derived from set point source 50.

The sides of confined plasma region 8 are bounded by spaced, vertically stacked louvers 44, made of a material that does not contaminate the chemistry of the plasma in region 8. The louvers 44 are made of a material that is either electrically insulating (preferably a dielectric, such as quartz) or somewhat electrically conductive (e.g. silicon carbide) so that the louvers are electrically powered, or float electrically or are electrically grounded. Louvers 44 are such that no substantial amount of plasma flows through the slots between louvers 44. However, un-ionized gas in region 8 escapes through the slots between louvers 44 to region 46 in chamber 10 between wall 12 and ring 32 and is pumped from the interior of chamber 10 by pump 9 through suitable openings in base 19.

Louvers 44 are fixedly spaced from each other in the vertical direction by a suitable spacing arrangement (not shown) and are driven up and down relative to each other and to bottom assembly 13 by motor 47 to control the pressure in confined plasma region 8. The pressure in region 8 is controlled by a pressure set point that set point source 25 supplies to controller 24 and an output signal of pressure gauge 48 in region 8. Controller 24 responds to the pressure set point and the output signal of pressure gauge 48 to control motor 47, and thereby vary the spacing between the bottom face of the lowest louver 44 and the top face of electrode assembly 13. Consequently, the pressure in region 8 is maintained at the pressure set point. Louvers 44 are arranged so that the louvers do not move in response to activation of motor 43, so that the pressure in confined plasma region 8 is controlled independently of the spacing between electrode assemblies 13 and 14.

Controller 24 responds to set point source 50 to control coupling of various combinations of several different RF frequencies from source arrangement 51 to electrodes 16, 34, 36 and 42. The different RF frequencies applied to electrodes 16, 34, 36 and 42 can have different powers and control different phenomena of the plasma in confined region 8. In the embodiment of FIG. 1, controller 24 selectively applies up to three frequencies from source arrangement 51 to electrodes 16, 34, 36 and 42. Source arrangement 51 is illustrated as including three separate sources 52, 54 and 56 that can be fixed frequency sources, but are preferably low-power, variable frequency oscillators. Alternately source arrangement 51 includes a single low power synthesizer that can derive three selected frequencies. The low power sources drive associated variable power gain RF power amplifiers having variable frequency pass bands that are varied as the frequency of the source associated with a particular amplifier is varied. To this end, each of sources 52, 54 and 56 has an associated frequency and power setting 58 and 59. Typically, the frequency of source 52 is in a relatively low range between 100 kHz and 10 MHz, the frequency of source 54 is in a midrange between 10 MHz and 150 MHz, and the frequency of source 56 is in a relatively high range between 27 MHz and 300 MHz. In one actually tested arrangement, the frequencies of sources 52, 54 and 56 were respectively set at 2 MHz, 27 MHz and 60 MHz. Various combinations of the frequencies and the powers of the RF energy applied to region 8 affect the distribution of the density of plasma, the ion energy and the DC bias voltage of the plasma in confined region 8, and the chemistry of the plasma in region 8.

The frequencies of sources 54 and 56 control the chemistry of the plasma because greater dissociation of the plasma occurs as the plasma excitation frequency increases, if all other significant plasma excitation parameters remain constant. In particular, there is an increase in the percentage of lighter etchant molecules in the plasma as frequency increases. The high frequencies applied to the plasma result in greater molecular fragmentation.

Driving electrodes 16, 34, 36 and 42 with various combinations of frequencies and powers from sources 52, 54 and 56 enables the plasma to be tailored for various purposes, e.g., to provide uniform or non-uniform plasma density, ion energy and molecular fragmentation.

Controller 24 responds to output signals from set point source 50 and the RF outputs of source arrangement 51 to control the application of several frequencies from source arrangement 51 to electrodes 16, 34, 36 and 42 in various combinations and permutations. In a particular embodiment, set point source 50 activates controller 24 so (1) at least one of the frequencies, but up to all three frequencies, from sources 52, 54 and 56 drive electrode 16 while electrodes 34, 36, and 42 are grounded; (2) at least two of the frequencies from sources 52, source 54 and 56 drive electrodes 16 and 36 while electrodes 34 and 42 are grounded; (3) only one of sources 54 or 56 drives either electrode 16 or 36 or only source 52 drives electrode 16, while electrodes 34 and 42 are grounded; (4) electrode 34 is driven by source 52 and/or source 54 or is connected to ground via a filter having a pass band for the frequency of source 52 and/or source 54 (i.e., frequencies F2 and F3) while the remaining electrodes 16, 36, and 42 have various connections to sources 52, 54, and 56; and (5) electrode 42 is driven by source 52 and/or source 54 or is connected to ground via a filter having a pass band for the frequency of source 52 and/or source 54 (i.e., frequencies F2 and F3) while the remaining electrodes 16, 34, and 36 have various connections to sources 52, 54, and 56.

Figure 2C:
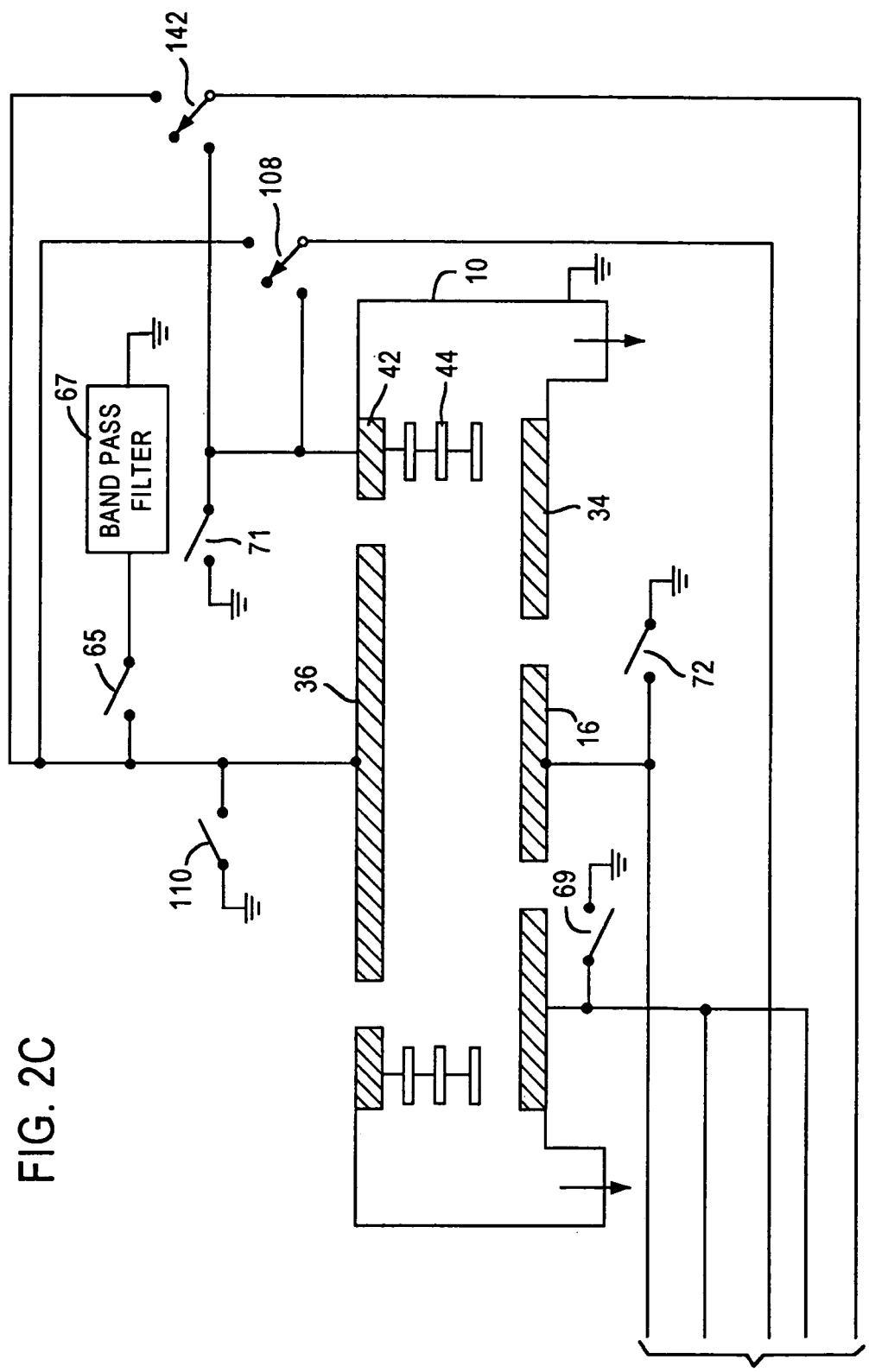

Reference is now made to FIG. 2 of the drawing, a block diagram including the circuitry of controller 24 for selectively coupling the output of sources 52, 54 and 56 to electrodes 16, 34, 36 and 42.

Low frequency source 52, having a frequency F1, drives only center electrode 16 of bottom electrode assembly 13. To this end, the output of source 52 is coupled to match/tunable ground network 58 via voltage, current and phase angle sensor 60, as well as switches 62 and 64. Network 58 includes variable reactances having values that are preset to provide approximate matching between the output impedance of source 52 and the expected impedance of the plasma in region 8 for the frequency of source 52. Sensor 60 derives output signals indicative of the current flowing between source 52 and match/tunable ground network 58, the voltage between the output of source 52 and ground 58 and the phase angle between the sensed voltage and current. Sensor 60 supplies these current, voltage and phase angle signals to controller 66, which responds to them to control the frequency of source 52 to maintain a substantially precise impedance match between the output impedance of source 52 and the impedance of the plasma at the frequency of source 52 in a manner known to those skilled in the art. Additionally, if the frequency of source 52 is fixed, sensor 60 supplies these current, voltage and phase angle signals which responds to them to control the variable reactances of matching network 58 to maintain a substantially precise impedance match between the output impedance of source 52 and the impedance of the plasma at the frequency of source 52 in a manner known to those skilled in the art. The variable reactances of network 58, when matched, are approximately tuned to the frequency of source 52 to provide a low impedance path for the frequency of source 52 in both directions and a high impedance path for the frequencies of sources 54 and 56 so that the frequencies of sources 54 and 56 are substantially attenuated, i.e., rejected by network 58. As the frequency of source 52 changes in response to set point changes thereof by an operator, controller 66 correspondingly varies the reactances of network 58 to maintain the low impedance path for the frequency of source 52 and approximate matching between the source output impedance and the impedance of the plasma for the frequency of source 52.

It is usually desirable when source 52 drives electrodes 16 for electric fields at the frequency of source 52 to subsist between electrodes 16 and 36. To this end, electrode 36 is selectively connected to ground through switch 65 and bandpass filter 67, having a center frequency equal to the nominal frequency of source 52, as set by the operator. Consequently, current at the frequency of source 52 flows from electrode 36 to ground through filter 67 which has a large impedance to the frequencies of sources 54 and 56 and therefore substantially blocks current at the frequencies of sources 54 and 56. Under this circumstance, it is frequently desirable to connect electrodes 34 and 42 to DC and RF ground, a result achieved by controller 24 closing switches 69 and 71, respectively connected between electrodes 34 and 42 and ground. For other purposes, controller 24 grounds electrode 16 for RF and DC by closing switch 72, connected between electrode 16 and ground.

In normal operation while source 52 drives electrode 16, switches 62 and 64 are connected as illustrated. However, under other circumstances, while source 52 is decoupled from electrode 16, switches 62 and 64 are activated by controller 24 so that switches 62 and 64 respectively engage first terminals of resistors 68 and 70, both of which have values equal to the output impedance of source 52. The second terminals of resistors 68 and 70 are connected to ground so that when source 52 is decoupled from electrode 16, the output of source 52 drives a load matched to the output impedance of source 52. Under these conditions, the input terminals of network 58 are connected across resistors 70 so the impedance from electrode 16 looking back into the output terminals of network 58 is the same as when source 52 is coupled to electrode 16. In addition, because network 58 is tuned approximately to the frequency of source 58, network 58 provides a low impedance at the frequency of source 52 from electrode 16 through the tuned circuitry of network 58 to ground through resistor 70 and a high impedance at the frequency of sources 54 and 56 from electrode 16 through the tuned circuitry of network 58 to ground through resistor 70.

Mid frequency source 54, having a frequency F2, can drive (1) only electrode 16, (2) only electrode 36, (3) both electrodes 16 and 36 simultaneously, (4) only electrode 34, (5) only electrode 42, (6) both electrodes 34 and 36 simultaneously, (7) both electrodes 34 and 42 simultaneously, and (8) both electrodes 36 and 42 simultaneously.

To these ends, the output of source 54 is coupled to three position coaxial RF switch 74, having first and second output terminals selectively connected to drive match/tunable ground networks 76 and 78 at separate times. Networks 76 and 78 are identical to each other and similar to network 66, except that networks 76 and 78 provide matching and a tunable ground for the frequency of source 54. As such, networks 76 and 78 pass current and voltage at the frequency of source 54, but block current and voltage at the frequencies of sources 52 and 56. Switch 74 includes a third terminal connected to an input port of power splitter 80, having first and second output ports on which are derived oppositely phased power at the frequency of source 54. The power at the output ports of splitter 80 can be the same or different, depending upon the design and setting of the splitter; the setting of splitter 80 can be set manually by the operator or automatically by controller 24 in response to a recipe program a memory of the controller stores. Power at the first and second output ports of splitter 80 is respectively simultaneously supplied to networks 76 and 78. Power is supplied from the first output terminal of switch 74 or the first output terminal of splitter 80 to the input terminals of network 76 via voltage, current and phase angle sensor 82, as well as switches 84 and 86, respectively selectively connected to ground through resistors 88 and 90. Power is supplied from the second output terminal of switch 74 or the second output terminal of splitter 80 to the input terminals of network 78 via voltage, current and phase angle sensor 92, as well as switches 94 and 96, respectively connected to ground through resistors 98 and 100. Controllers 102 and 104 are respectively associated with networks 76 and 78, as well as sensors 82 and 92. Controllers 102 and 104 respond to the outputs of sensors 82 and 92 and operator inputs to control the values of the reactances of network 76 and 78 and the frequency of source 54 in the same manner as described supra for controller 66.

Three position coaxial RF switch 106 responds to control signals from controller 24 to selectively connect the output of network 76 to electrode 16 or electrode 34, or open circuit the output of network 76. Three position coaxial RF switch 108 operates in conjunction with switch 106 by responding to control signals from controller 24 to selectively connect the output of network 78 to electrode 36 or electrode 42, or open circuit the output of network 78. While controller 24 activates switch 74 to couple the output of source 54 to network 76, the controller activates switch 106 to connect the output of network 76 to either electrode 16 or electrode 34. If controller 24 causes the output of network 76 to be coupled to electrode 16 by causing switch 74 to engage the first output terminal of switch 74, the controller (1) opens switch 72 to prevent electrode 16 from being grounded and (2) either opens or closes switch 69 to decouple electrode 34 from ground or to ground electrode 34, respectively. If controller 24 causes the output of network 76 to be coupled to electrode 34 by causing switch 74 to engage the first output terminal of switch 74, the controller (1) opens switch 69 to prevent electrode 34 from being grounded and (2) either opens or closes switch 72 to decouple electrode 16 from ground or to ground electrode 16, respectively. If controller 24 causes the output of network 78 to be coupled to electrode 36 by causing switch 74 to engage the second output terminal of switch 74, the controller (1) opens switch 110 that RF and DC grounds electrode 36, when closed, and (2) either opens or closes switch 71 to decouple electrode 42 from ground or to ground electrode 42, respectively. If controller 24 causes the output of network 78 to be coupled to electrode 42 by causing switch 74 to engage the second output terminal of switch 74, the controller (1) opens switch 71 to decouple ground from electrode 42 and (2) either opens or closes switch 110 to decouple electrode 36 from ground or to ground electrode 36, respectively. If controller 24 activates switch 74 so that splitter 80 simultaneously supplies power to networks 76 and 78, controller 24 activates switches 69, 71, 72 and 110 to prevent any of electrodes 16, 34, 36 or 42 that are connected to the output terminals of network 76 and/or 78 from being grounded.

High frequency source 56, having a frequency F3, can drive (1) only electrode 16, (2) only electrode 36, (3) both electrodes 16 and 36 simultaneously, (4) only electrode 34, (5) only electrode 42, (6) both electrodes 34 and 36 simultaneously, (7) both electrodes 34 and 42 simultaneously, and (8) both electrodes 36 and 42 simultaneously.

To these ends, the output of source 56 drives circuitry that is identical to the circuitry that source 54 drives, except that the match/tunable ground networks 112 and 114 associated with source 56 are preset to be tuned to the nominal frequency of source 56 so networks 112 and 114 pass the current and voltage from source 56, but block the current and voltage of sources 52 and 54. Thus, the output of source 56 is coupled to three position coaxial RF switch 116, having first, second and third output terminals respectively connected to drive networks 112 and 114 and splitter 118, having first and second output terminals connected to drive input terminals of networks 112 and 114. The first output terminals of switch 116 and splitter 118 are selectively connected to the input terminals of matching network 112 via voltage, current and phase angle sensor 120, as well as switches 122 and 124, while the second output terminals of switch 116 and splitter 118 are selectively connected to the input terminals of matching network 114 via voltage, current and phase angle sensor 126, as well as switches 128 and 130. Switches 122, 124, 128 and 130 are respectively selectively connected to ground by resistors 131–134, each of which has a value equal to the output impedance of source 56. Controllers 136 and 138 are respectively associated with networks 112 and 114, as well as sensors 120 and 126, to control networks 112 and 114, as well as the frequency of source 56.

Controller 24 activates (1) three position coaxial switch 140 to selectively connect the output of network 112 to either electrode 16 or electrode 34 or to neither electrode 16 or electrode 34, and (2) three position coaxial switch 142 to selectively connect the output of matching network 114 to either electrode 36 or electrode 42 or to neither electrode 36 or electrode 42. Controller 24, in conjunction with activation of switches 116 and 142, activates switches 69, 72 and 110 to prevent any of electrodes 16, 34, 36 or 42 which are connected to the output terminals of networks 112 and 114 from being grounded, as described supra in connection with the circuitry associated with source 54.

Controller 24 activates the various switches of FIG. 2 to provide great versatility to the various combinations and permutations of the several frequencies that can be applied to electrodes 16, 34, 36 and 42. For example, the low, medium and high frequencies of sources 52, 54 and 56 can be simultaneously applied to electrode 16 while switches 69, 71 and 110 are closed to ground electrodes 34, 36 and 42. Under these circumstances, different portions of the energy at each of the frequencies of sources 52, 54 and 56 is shunted to ground in plasma confinement region 8, as a result of electric field coupling from electrode 16 to the ground potential of electrodes 34, 36 and 42. The amount of energy at each of frequencies F1, F2 and F3 coupled from electrode 16 to the ground potential of electrodes 34, 36 and 42 is a function of (1) the wavelength associated with each of the three frequencies, (2) the distance between electrodes 16 and 36, (3) the distance between electrodes 16 and 34, and (4) the distance between electrodes 36 and 42. The distances between the various combinations of electrodes in chamber 10 are controlled by the geometry of the electrodes and by motor 47, inter alia.

A second exemplary situation involves applying the low and medium frequencies to bottom electrode 16, while applying the high frequency to top electrode 36, while grounding electrodes 34 and 42 and closing switch 65 so a low impedance path is provided through bandpass filter 67 for only the low frequency from electrode 36 to ground. In addition, switches 96 and 142 are activated to connect electrode 36 to the output terminal of network 78 and the input terminal of network 78 to ground through resistor 100, resulting in a low impedance path to ground through network 78 from electrode 36 for the mid-frequency of source 54. Because of the high frequency of source 56 and relatively close spacing between electrodes 36 and 42, the electric field at the high frequency has a tendency to remain primarily in the upper portion of region 8 to provide a relatively large electric field density for dissociation purposes to the gas flowing from source 37 into region 8. The electric field at the high frequency does not have a tendency to be coupled to electrode 16 because there is no low impedance path at the high frequency from electrode 16 to ground. Networks 58 and 76 are effectively bandpass filters for the low and medium frequencies that reject current at the high frequency. Because networks 58 and 76 have a high impedance to the high frequency, networks 58 and 76 decouple the high frequency from electrode 16.

In contrast to the electric field associated with high frequency F3, the electric field associated with the low frequency F1 of source 52 extends from electrode 16 to (1) electrode 34, (2) electrode 36 and (3) electrode 42. The resulting current at frequency F1 in electrode 36 flows through the low impedance path of filter 67 to ground.

Consequently, the electric field associated with frequency F1 affects ion energy throughout region 8.

The electric field associated with medium frequency F2 of source 54 extends primarily from electrode 16 to electrode 34, as well as to electrode 36, and to a lesser extent to electrode 42. The resulting current at frequency F2 in electrode 36 flows through the low impedance path of network 78 to ground via switches 108 and 96 and resistor 100.

A third exemplary situation involves applying the low and medium frequencies to bottom electrode 16 and the medium frequency to top electrode 36 while grounding electrodes 34 and 42 and closing switch 65 so a low impedance path is provided for only the low frequency from electrode 36 to ground through bandpass filter 67. Thereby, the low frequency of source 52 is coupled to the plasma in region 8 in the same manner as described supra for the second exemplary situation. The high frequency of source 56 is not a factor for the third exemplary situation because controller 24 causes switches 140 and 142 to engage the open circuited terminals thereof. The medium frequency of source 54 is coupled to electrodes 16 and 36 by virtue of switch 74 engaging its third output terminal so that splitter 80 is responsive to power from source 54. Controller 24 activates switches 106 and 108 so that the outputs of networks 76 and 78 respectively drive electrodes 16 and 36. Consequently, electric fields at the medium frequency are coupled between (1) electrodes 16 and 36, (2) electrodes 16 and 34, and (3) electrodes 36 and 42. As a result, electric fields at the medium frequency affect ion energy, plasma density and molecular dissociation throughout region 8.

A fourth exemplary situation involves applying the low frequency to electrode 16 and the medium and high frequencies to electrode 36, while electrodes 34 and 42 are grounded. In this situation, controller 24 activates (1) switches 74 and 116 to the second positions thereof, (2) switches 108 and 142 so the output terminals of network 78 and 114 are connected to electrode 36, (3) switches 94 and 96 so the input terminals of network 78 are connected to sensor 92, (4) switches 128 and 130 so the input terminals of network 114 are connected to sensor 126, (5) switches 106 and 140 so the output terminals of networks 76 and 112 are respectively connected to electrode 16 and open circuited, and (6) switches 86 and 124 so the input terminals of networks 76 and 112 are connected to ground through resistors 90 and 132, respectively. Consequently, the low frequency of sources 52 has a low impedance path from electrode 36 to ground through bandpass filter 67, but the frequencies of sources 54 and 56 do not have such low impedance paths from electrode 36 to ground. As a result, the low frequency of source 52 is coupled to the plasma in region 8 in the same manner as described supra for the second exemplary situation. Low impedance paths exist from the output terminals of network 78 through switch 108 to electrode 36, thence through the plasma in region 8 to (1) electrode 16 to ground through network 76, switch 86 and resistor 98 and (2) electrode 42 to ground. Consequently, substantial electric fields at the medium frequency are in region 8 between electrodes 36 and 42, as well as between electrodes 16 and 36. As a result, there is primary control of ion distribution in the upper portion of region 8, as well as across the center portion of region 8 between electrodes 16 and 36. The only low impedance path for the high frequency of source 56 for this situation is between electrodes 36 and 42. There is no low impedance path between electrodes 16 and 36 for the high frequency of source 56 because electrode 16 is decoupled from the output terminals of network 112 by virtue of switch 140 being open circuited. The spacing between electrodes 36 and 34 for the high frequency of source 56 is such that the impedance for the high frequency through the plasma between electrodes 34 and 36 is substantially greater than the impedance between electrodes 36 and 42. Consequently, the high frequency of source 56 affects the plasma in region 8 in the same manner as described supra for the second exemplary situation.

In a fifth exemplary situation, the low and medium frequencies of sources 52 and 54 are applied to bottom electrode 16, while each of electrodes 34, 36 and 42 is grounded. To this end, controller 24 activates switch 106 to connect the output of network 76 to electrode 16, while closing each of switches and 69, 71 and 10. The plasma in region 8 is thereby affected by the low and medium frequencies of sources 52 and 54 in the same way as described for the low and medium frequencies for the first exemplary situation. The plasma in region 8 is not affected by the high frequency of source 56 for the same reasons set forth in the third exemplary situation.

In other exemplary situations, controller 24 can control the various switches of FIG. 2 so only the low frequency of source 52 is connected to electrode 16 and neither source 54 nor source 56 is connected to any of the electrodes. In such a situation, controller 24 closes switch 110 and chamber 10 processes the workpiece in a somewhat primitive manner. Alternatively, controller 24 can connect the output of either or both of sources 54 and 56 to any of electrodes 16, 34, 36 or 42. For example, it may be desirable to couple the high frequency of source 56 between electrodes 16 and 36, while coupling the medium frequency of source 54 between electrodes 36 and 34. In such a situation, controller 24 (1) opens switches 69, 71, 72 and 110, (2) activates switches 74, 94 and 96 and switches 116, 128 and 130 so the outputs of sources 54 and 56 are respectively applied to input terminals of networks 78 and 114, (3) activates switches 108 and 142 so the outputs of networks 78 and 114 are connected to electrode 36, (4) activates switches 106 and 86 so there is a low impedance path from electrode 34 to ground through network 76 and resistor 94 for the medium frequency of source 54, and (5) activates switches 140 and 124 so there is a low impedance path from electrode 16 to ground through network 112 and resistor 132 for the high frequency of source 56. Consequently, electric fields are established in region 8 for (1) only the high frequency of source 56 between electrodes 16 and 36 and (2) only the medium frequency of source 54 between electrodes 34 and 36. Because there is no low impedance path to ground from electrode 16 for the medium frequency of source 54 there is no substantial electric field established in region 8 between electrodes 16 and 36 for the medium frequency. Because there is no low impedance path to ground from electrode 34 for the high frequency of source 56, there is no substantial electric field for the high frequency established in region 8 between electrodes 34 and 36. It is also to be understood that suitable bandpass filter circuitry similar to that described and illustrated can be employed for providing a low impedance path between electrodes 36 and 42 only for the high frequency of source 56.

Figure 3:
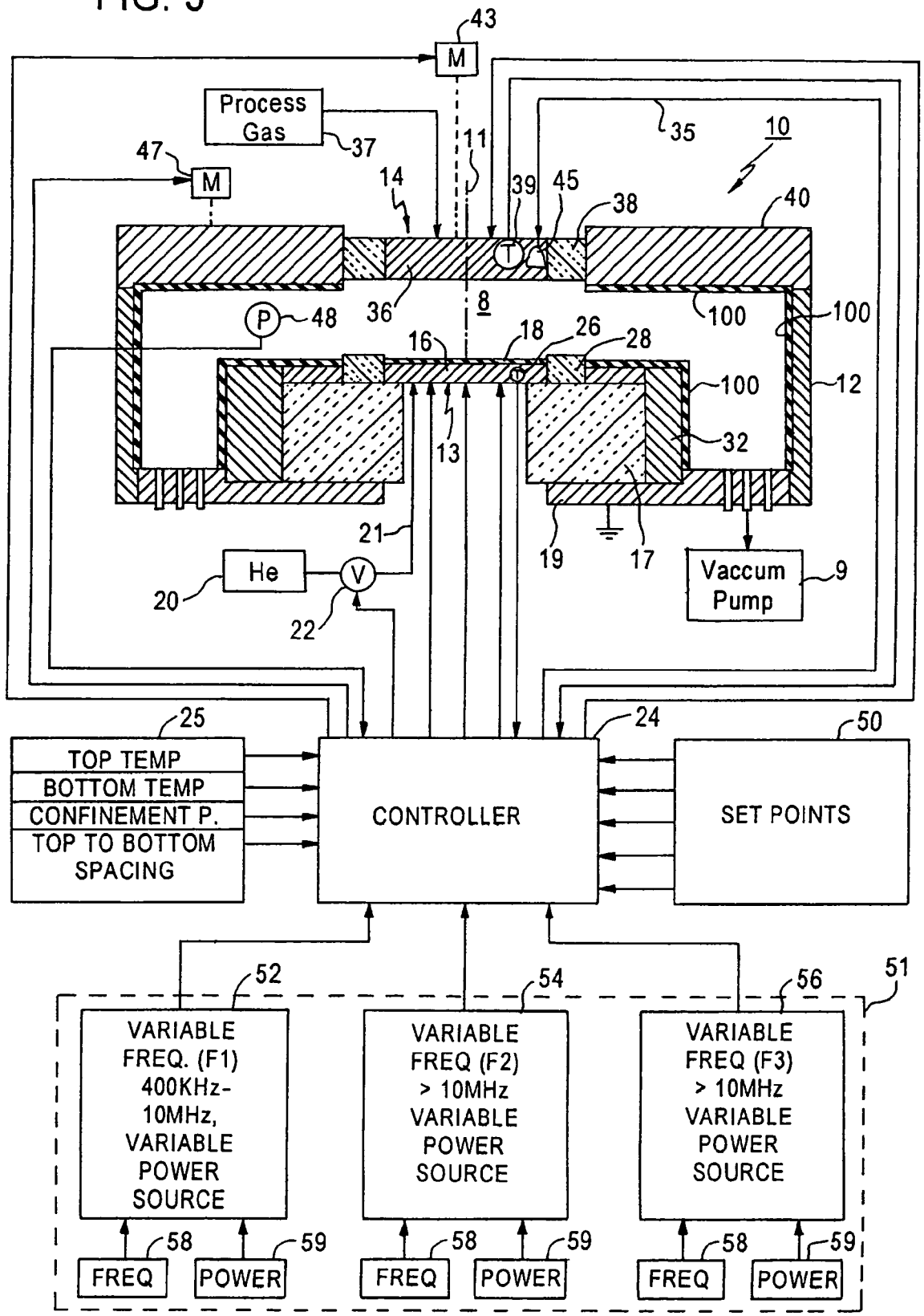
FIG. 3 is a partially schematic diagram of a vacuum plasma processor in accordance with another embodiment of the present invention.

Reference is now made to FIG. 3 of the drawing, a schematic diagram of a second embodiment of chamber 10. The embodiment of FIG. 3 is similar to the embodiment of FIG. 1, but the embodiment of FIG. 3 has a much larger volume plasma confinement region that extends to chamber wall 12 and base 19. Consequently, the embodiment of FIG. 3 does not include louvers 44 and the pressure of the plasma processing workpiece 18 is controlled exclusively by using pressure control for vacuum pump 9. The entire bottom face of metal ring 40, the side wall of ring 32 and the interior surface of side wall 12 are all grounded and define parts of the boundary of the plasma confinement region in the embodiment of FIG. 3. To prevent chemical contamination by the plasma of any of the bottom face of metal ring 40, the side wall of ring 32 or the interior surface of side wall 12, all of these surfaces are covered with plates 100 made of an electrically conductive or dielectric material, such as intrinsic silicon, that does not contaminate the chemistry of the plasma in region 8. Because side wall 12 is part of the plasma confinement region in the embodiment of FIG. 3, the temperature of the side wall is controlled in a manner similar to that described for control of electrode assembly 14 in the embodiment of FIG. 1.

The electrodes in the embodiment of FIG. 3 are responsive to several RF frequencies and controlled as described supra in connection with FIGS. 1 and 2. The electric fields in the chamber of FIG. 3 differ considerably from the electric fields in the chamber of FIG. 1 because of the large volume and complex shape of the plasma confinement region in the FIG. 3 embodiment. However, the electric field effects on the plasma are somewhat similar in the embodiment of FIG. 3 to those described in connection with the embodiment of FIGS. 1 and 2.

Figure 9A:
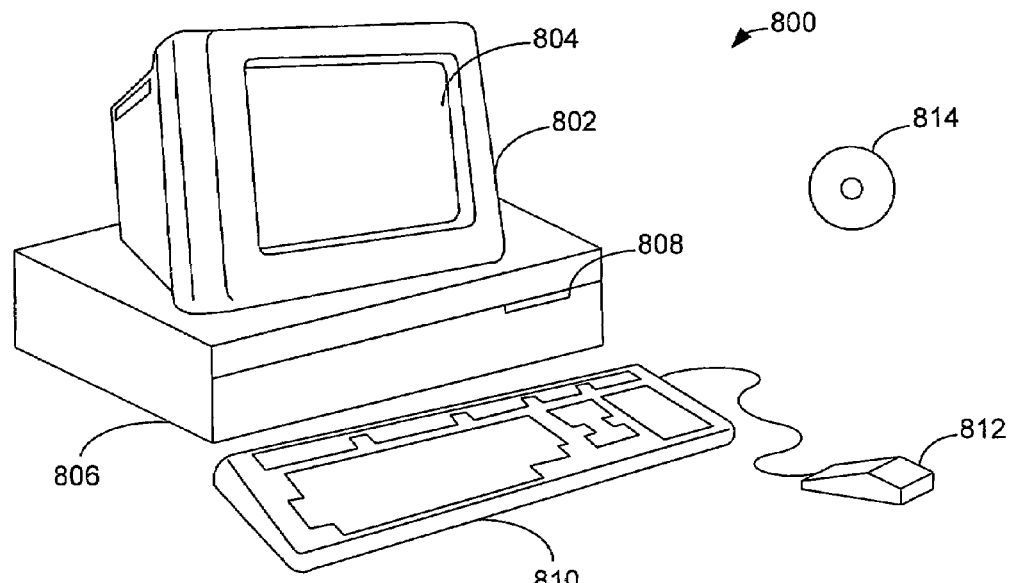
FIGS. 9A and 9B illustrate a computer system, which is suitable for implementing a controller.
Figure 9B:
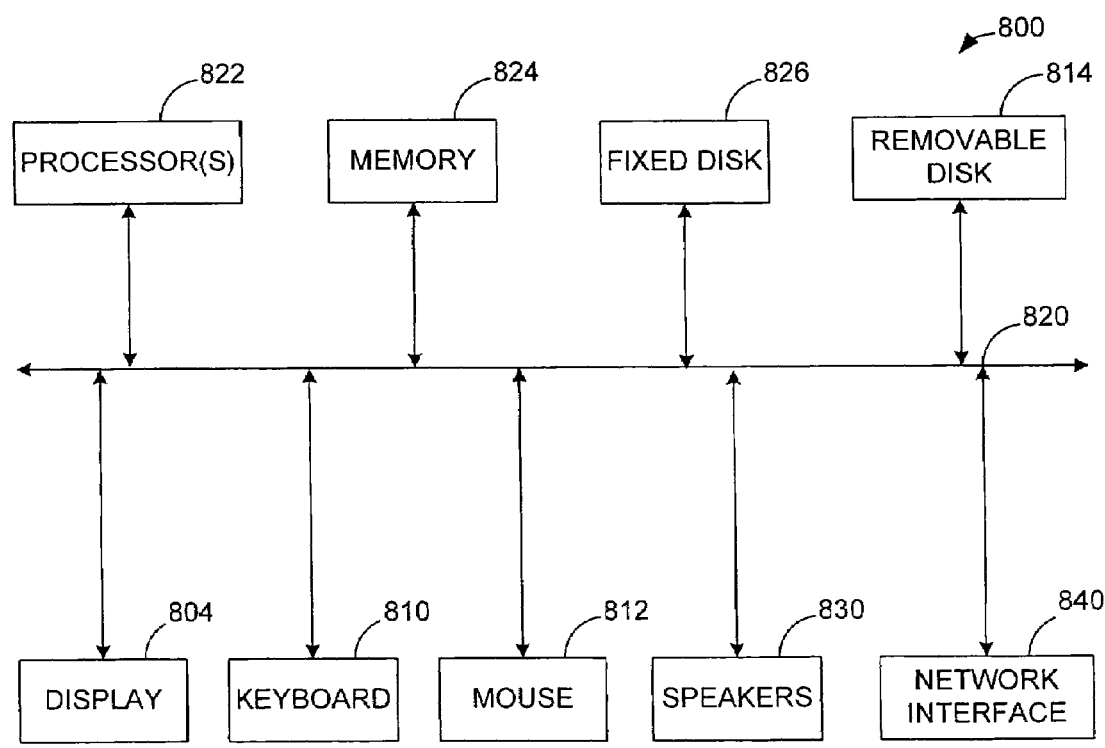

FIGS. 9A and 9B illustrate a computer system 800, which is suitable for implementing a controller 24 used in embodiments of the present invention. FIG. 9A shows one possible physical form of the computer system. Of course, the computer system may have many physical forms ranging from an integrated circuit, a printed circuit board, and a small handheld device up to a huge super computer. Computer system 800 includes a monitor 802, a display 804, a housing 806, a disk drive 808, a keyboard 810, and a mouse 812. Disk 814 is a computer-readable medium used to transfer data to and from computer system 800.

FIG. 9B is an example of a block diagram for computer system 800. Attached to system bus 820 is a wide variety of subsystems. Processor(s) 822 (also referred to as central processing units or CPUs) are coupled to storage devices, including memory 824. Memory 824 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 826 is also coupled bi-directionally to CPU 822; it provides additional data storage capacity and may also include any of the computer-readable media described below. Fixed disk 826 may be used to store programs, data, and the like and is typically a secondary storage medium (such as a hard disk) that is slower than primary storage. It will be appreciated that the information retained within fixed disk 826 may, in appropriate cases, be incorporated in standard fashion as virtual memory in memory 824. Removable disk 814 may take the form of any of the computer-readable media described below.

CPU 822 is also coupled to a variety of input/output devices, such as display 804, keyboard 810, mouse 812 and speakers 830. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 822 optionally may be coupled to another computer or telecommunications network using network interface 840. With such a network interface, it is contemplated that the CPU might receive information from the network, or might output information to the network in the course of performing the above-described method steps. Furthermore, method embodiments of the present invention may execute solely upon CPU 822 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 4:
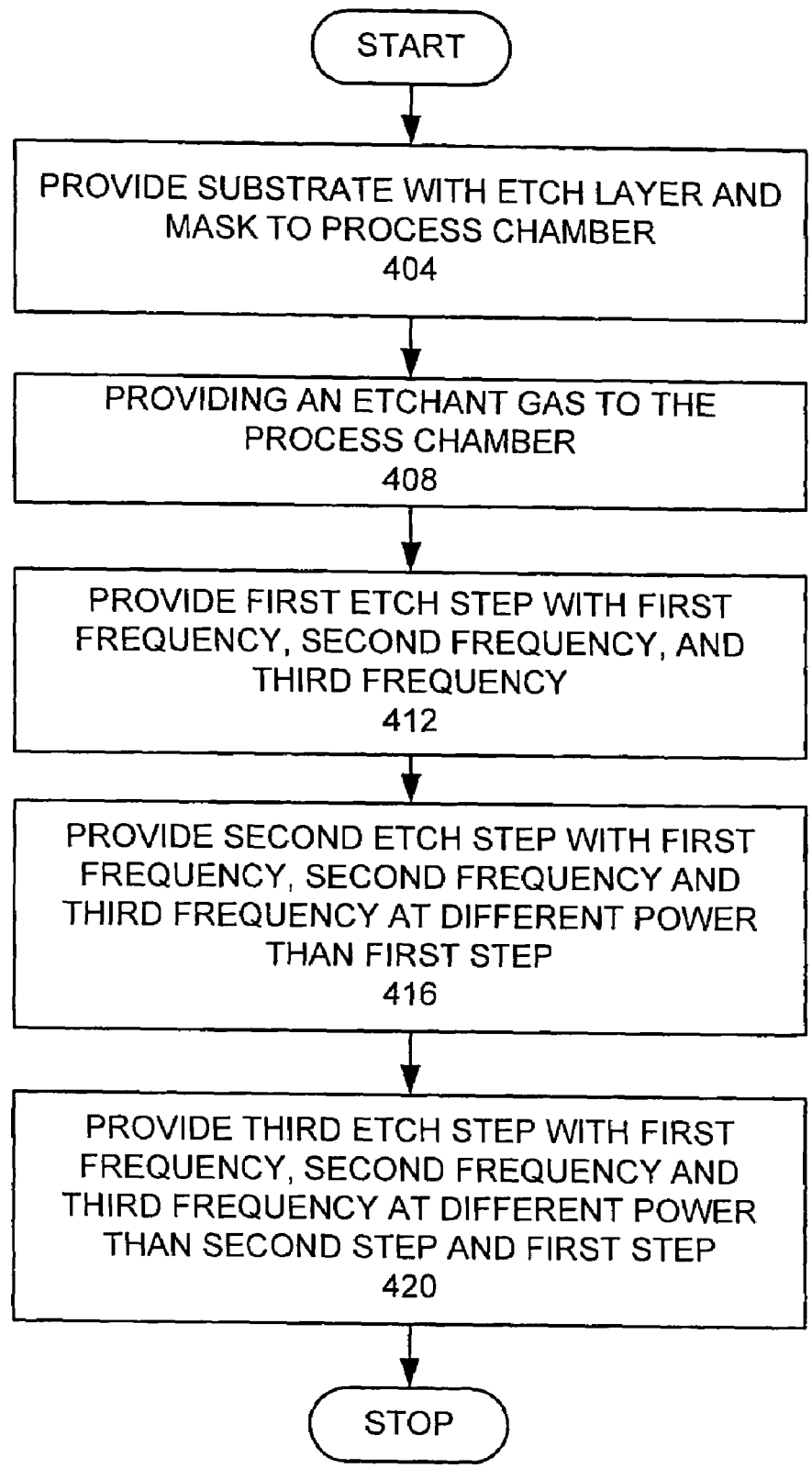
FIG. 4 is a high level flow chart of a process used in an embodiment of the invention.
Figure 5A:
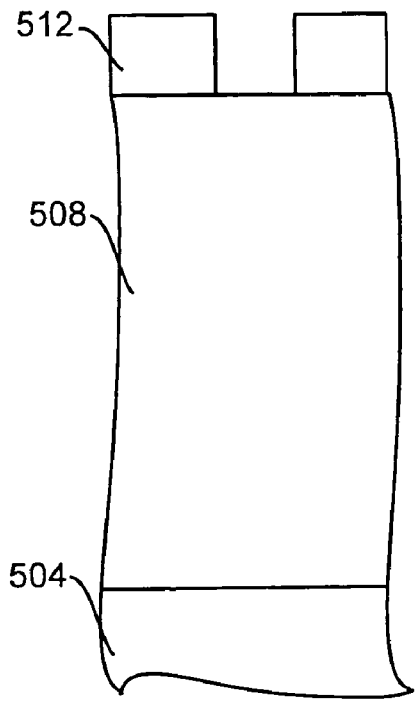
FIGS. 5A–D are schematic cross-sectional views of a substrate with an etch layer into which a high aspect ratio feature is etched.

FIG. 4 is a high level flow chart of a process used in an embodiment of the invention. A substrate with an etch layer and a mask over the etch layer is placed in a process chamber (step 404). The process chamber may be either chamber as illustrated in FIG. 1 and FIG. 3, which is able to provide RF power at at least three different frequencies simultaneously. FIG. 5A is a schematic cross-sectional view of a substrate 504 with a layer 508 that has to be etched over which a mask 512 has been placed. The mask material that has to be etched can be either photoresist of various types (e.g. DUV, 193 nm or 157 nm) or different hardmask materials (e.g. polysilicon, Titanium Nitride etc.)

Figure 5B:
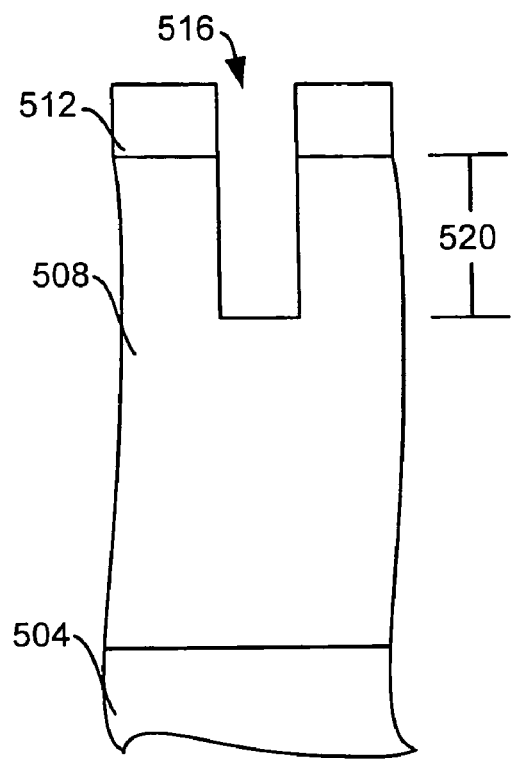

An etchant gas is provided to the process chamber (step 408). The etchant gas may be a conventional etchant gas. A first etch step is provided with a first frequency, a second frequency different from the first frequency, and a third frequency different from the first and second frequencies, where the first etch etches a feature in the dielectric layer to a first depth (step 412). FIG. 5B is a schematic cross-sectional view of the substrate 504 with the etch layer 508, after a feature 516 has been etched in the etch layer 508 to a first depth 520. The power settings for the RF sources are optimized to etch to the first depth producing the aspect ratio of the feature width to the feature depth. In an example, the first frequency is at a first power, the second frequency is at a second power, and the third frequency is at a third power, where the at least the first power and the third power are greater than zero and where the first etch etches a feature in the dielectric layer to a first depth.

Figure 5C:
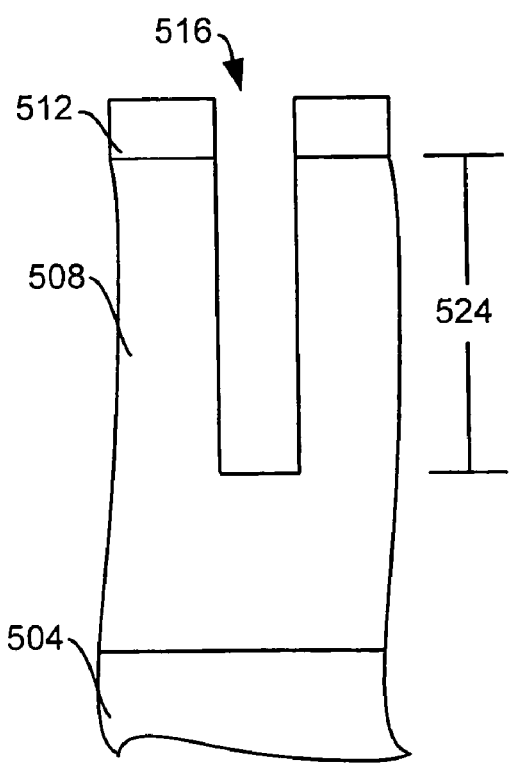

A second etch step is provided at a different power than the first step, where the second etch etches the feature in the dielectric layer to a second depth greater than the first depth (step 416). FIG. 5C is a schematic cross-sectional view of the substrate 504 with the etch layer 508, after the feature 516 has been etched in the etch layer 508 to a second depth 524 deeper than the first depth. The power settings for the RF sources are optimized to etch from the first depth to the second depth producing the aspect ratio of the feature width to the feature depth. To continue with the above example, the first frequency is at a fourth power level, the second frequency is at a fifth power level, and the third frequency is at a sixth power level, where at least one of the fourth and sixth powers is greater than zero and the fifth power is greater than zero and where a condition is selected from the group of the first power not being equal to the fourth power and the third power not being equal to the sixth power, wherein the second etch etches the feature in the dielectric layer to a second depth greater than the first depth.

Figure 5D:
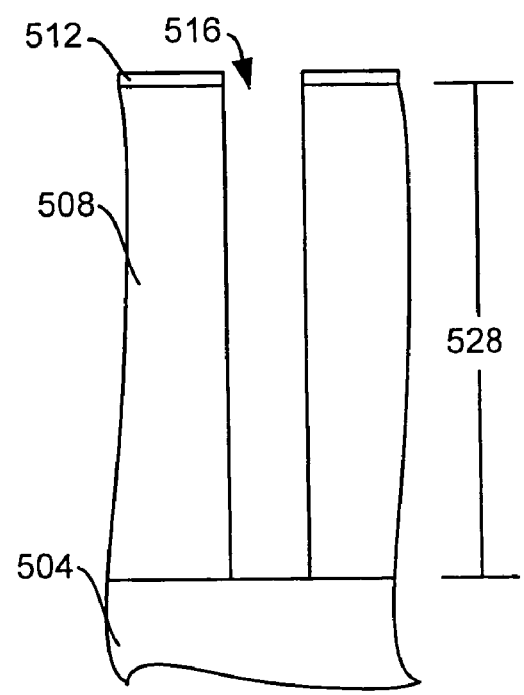

A third etch step is provided at a different power than the second, where the third etch etches the feature in the dielectric layer to a third depth greater than the second depth (step 416). FIG. 5D is a schematic cross-sectional view of the substrate 504 with the etch layer 508, after the feature 516 has been etched in the etch layer 508 to a third depth 528 deeper than the second depth. The power settings for the RF sources are optimized to etch from the second depth to the third depth producing the required aspect ratio of the feature width to the feature depth. To continue the above example, the first frequency is at a seventh power level, the second frequency is at a eighth power level, and the third frequency is at a ninth power level, where at least two of the seventh, eighth, and ninth powers are greater than zero and where a condition is selected from the group of the seventh power not being equal to the fourth power, the eighth power not being equal to the fifth power, and the ninth power not being equal to the sixth power, wherein the third etch etches the feature in the dielectric layer to a third depth greater than the second depth. The high aspect ratio contact etching is not necessarily limited to only 3 steps. As the control of the HAR etch is required, more or less number of steps can be used in order to control the profile along the etch process.

For high aspect ratio contacts HARC, as a contact is etched deeper, etching mechanisms change. For example, as the etch depth increases, the etch rate decreases. In addition, bowing may increase and etch selectivity to the mask may decrease. The use of at least three frequencies and changing the power of these frequencies as the etch proceeds allows for the resulting plasma to be tailored to the etch depth and required profile providing an improved, optimized etch. This may be done by using different RF powers of various frequencies, using the same etch reactants mixture. Usually, in order to control the profile along the etch, different etch reactant mixtures are used. The reason for this approach is mainly because they provide different species in the plasma. Instead, in this invention, control of speciations in the plasma is by using RF powers of various frequencies.

Figure 6A:
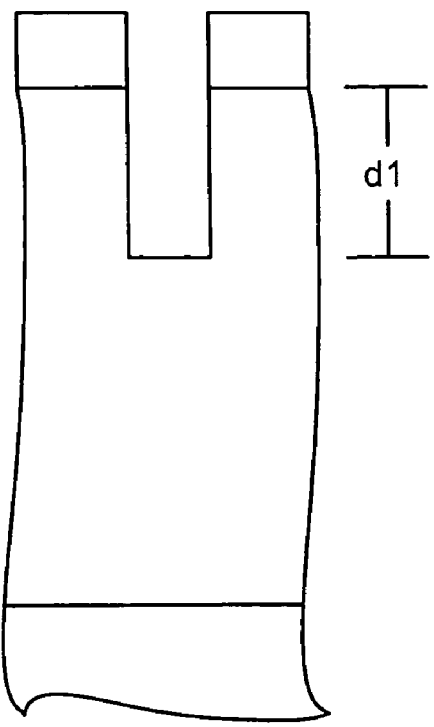
FIGS. 6A–C are schematic cross-sectional views of a substrate for increasing aspect ratio of the feature as the etch process progresses.
Figure 6B:
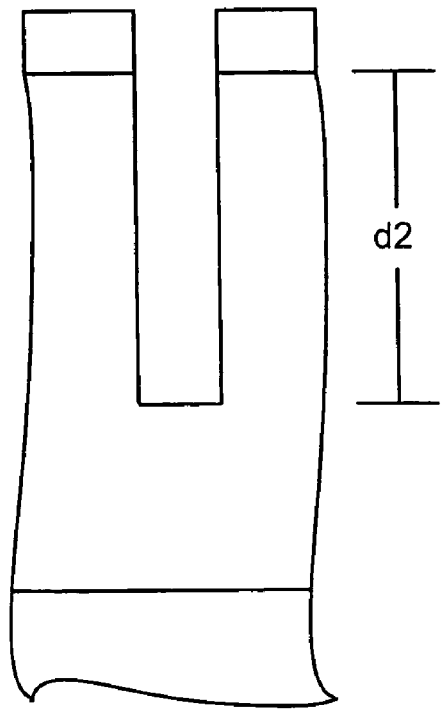
Figure 6C:
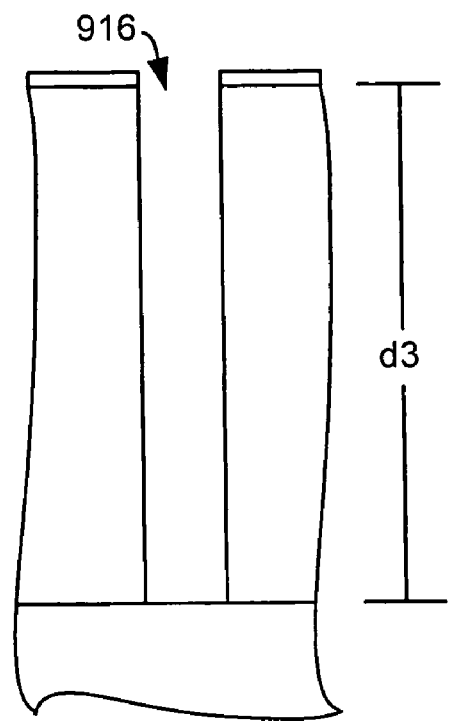

FIGS. 6A–C summarize the etch profile at a specific time during the etch and the power conditions (presented in the preceding paragraphs) required for every step. This schematic refers to a 3 step etch process where d1 is the etch depth after the step S1 (shown in FIG. 6A), d2 is the etch depth after the step S2 (shown in FIG. 6B), d3 is the etch depth after the step S3 (Shown in FIG. 6C). P1 to P9 are the notations for the power level used and F1, F2, F3 are the used frequencies.

Table 1 summarizes the power conditions required for each of the three steps.

TABLE 1

|  | Step 1 | Step 2 | Step 3 |
|---|---|---|---|
| Conditions | F1_at power_P1<br>F2_at power_P2 | F4_at power_P4<br>F5_at power_P5 | F7_at power_P7<br>F8_at power_P8 |

TABLE 1-continued

| Step 1 | Step 2 | Step 3 |
|---|---|---|
| F3_at power_P3<br>(P1 > 0 and P3 > 0)<br>or<br>(P1 > 0 and P2 > 0) | F6_at power_P6<br>P4 ≠ P1 or P6 ≠ P3<br>or P5 ≠ P1<br>(P4 > 0 and (P5 > 0<br>or P6 > 0))<br>or<br>(P4 > 0 and (P5 > 0<br>and P6 > 0)) | F9_at power_P9<br>P7 ≠ P4 or P8 ≠ P5<br>or P9 ≠ P6<br>(P7 > 0 and P8 > 0)<br>or<br>(P7 > 0 and P9 > 0)<br>or<br>(P8 > 0 and P9 > 0)<br>or<br>(P7 > 0 and P8 > 0<br>and P9 > 0) |

For step S1, shown in FIG. 6A, frequency F1 is set to power level P1, frequency F2 is set to power level P2, and frequency F3 is set to power level P3. (P1>0 and P3>0) or (P1>0 and P2>0).

For S2, shown in FIG. 6B, frequency F1 is set to power level P4, frequency F2 is set to power level P5, and frequency F3 is set to power level P6. P4≠P1 or P6≠P3 or P5≠P1. (P4>0 and (P5>0 or P6>0)) or (P4>0 and (P5>0 and P6>0)).

For S3, shown in FIG. 6C, frequency F1 is set to power level P7, frequency F2 is set to power level P8, and frequency F3 is set to power level P9. P7≠P4 or P8≠P5 or P9≠P6. (P7>0 and P8>0) or (P7>0 and P9>0) or (P8>0 and P9>0) or (P7>0 and P8>0 and P9>0).

This case is particularized for simplicity, but combinations or permutations of these steps can be possible (e.g. have step S2 instead of S3, and S3 instead of S2, OR even have S3 excluded). Also, depending of the difficulty of the etch, more etch steps can be added in order to perform the full etch process. Also alternating between etch steps is possible (e.g. run S2 followed by S3, each of them for shorter time periods, and followed subsequently by the runs S2 and S3 again).

Preferably, the first frequency is in the range from 100 kHz to 10 MHz. More preferably, the first frequency is about 2 MHz. Preferably, the second frequency is in the range from 10 MHz to 35 MHz. More preferably, the second frequency is about 27 MHz. Preferably, the third frequency is greater than 40 MHz. More preferably, the third frequency is about 60 MHz.

Figure 7:
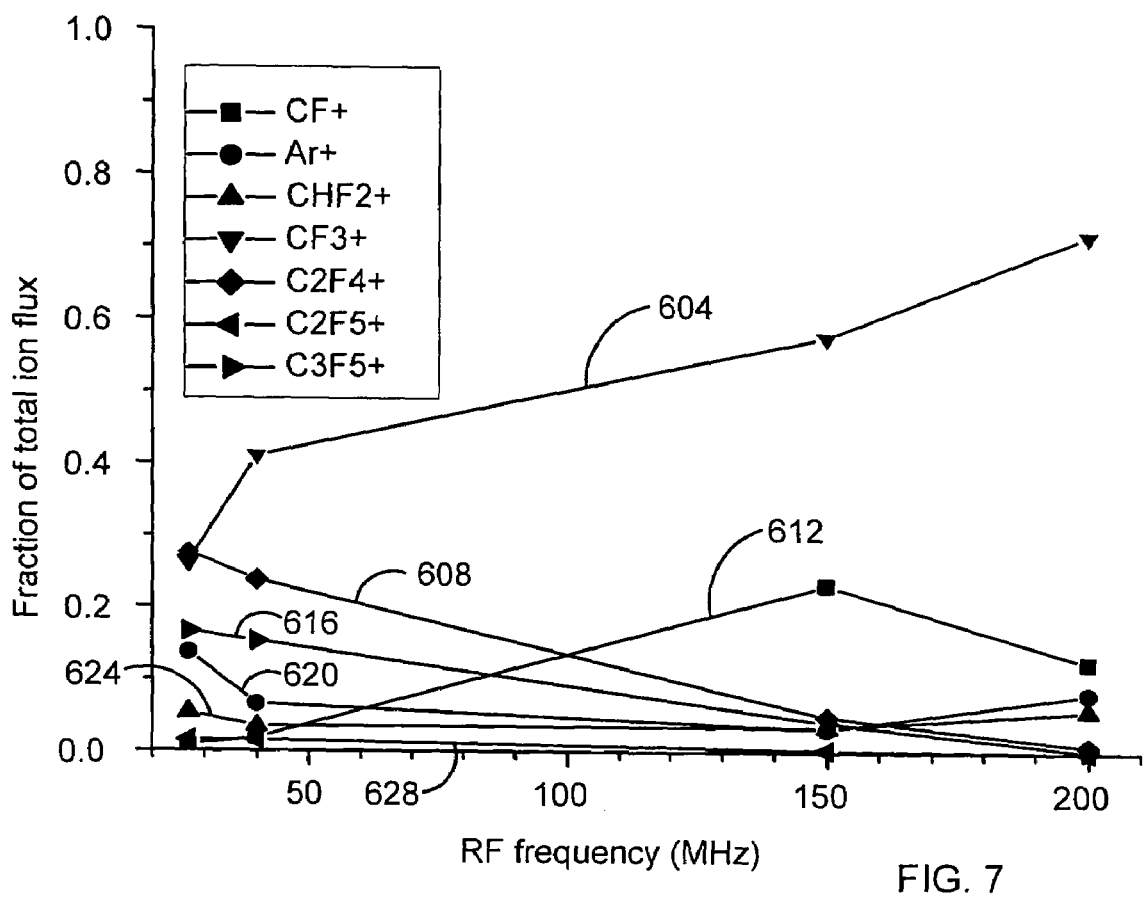
FIG. 7 shows the plasma speciation for the same chemistry and same power levels as function of RF frequency supplied.

The speciation for the same etch chemistry mixture and the same power level is represented in FIG. 7. The ion flux of each particular ion was normalized to unity for each particular frequency. A first curve 604 shows the fraction of total ion flux for $CF_3^+$ at various frequencies. A second curve 608 shows the fraction of total ion flux for $C_2F_4^+$ at various frequencies. A third curve 612 shows the fraction of total ion flux for $CF^+$ at various frequencies. A fourth curve 616 shows the fraction of total ion flux for $C_3F_5^+$ at various frequencies. A fifth curve 620 shows the fraction of total ion flux for $Ar^+$ at various frequencies. A sixth curve 624 shows the fraction of total ion flux for $CHF_2^+$ at various frequencies. A seventh curve 628 shows the fraction of total ion flux for $C_2F_5^+$ at various frequencies. This graph illustrates how various frequencies influence the fraction of speciation. Therefore, the speciation in the plasma can be controlled by varying the RF frequency along the etch process.

Figure 8A:
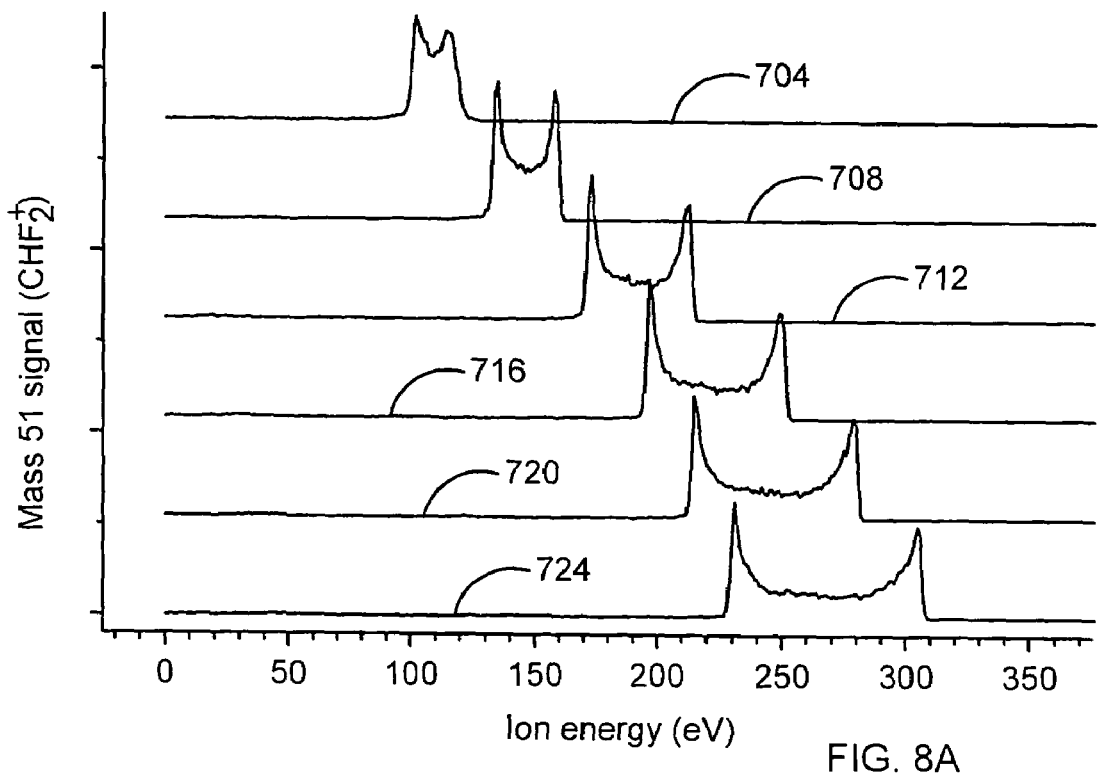
FIGS. 8A–B are graphs of ion energy and distribution at various powers at different frequencies.

FIG. 8A shows the variation of the ion energy and distribution as a function of RF power for the same frequency (27 MHz). The ion energy distribution of one of the main ions in a hydrofluorocarbon plasma: $CHF_2^+$ (having a mass of 51 atomic units) is represented here. The curve 704 shows ion energy and distribution for the ion $CHF_2^+$ when only a 27 MHz signal is supplied to the plasma at the power level of 200 W. The curve 708 shows ion energy and distribution for the ion $CHF_2^+$, when the 27 MHz signal is supplied at 400 Watts. The third curve 712 shows ion energy and distribution for the ion $CHF_2^+$, when the 27 MHz signal is supplied at 800 Watts. The fourth curve 716 shows ion energy and distribution for the ion $CHF_2^+$, when the 27 MHz signal is supplied at 1200 Watts. The fifth curve 720 shows ion energy and distribution for the ion $CHF_2^+$, when 27 MHz signal is supplied at 1600 Watts. The sixth curve 724 shows ion energy and distribution for the ion $CHF_2^+$, when the 27 MHz signal is supplied at 2000 Watts.

Figure 8B:
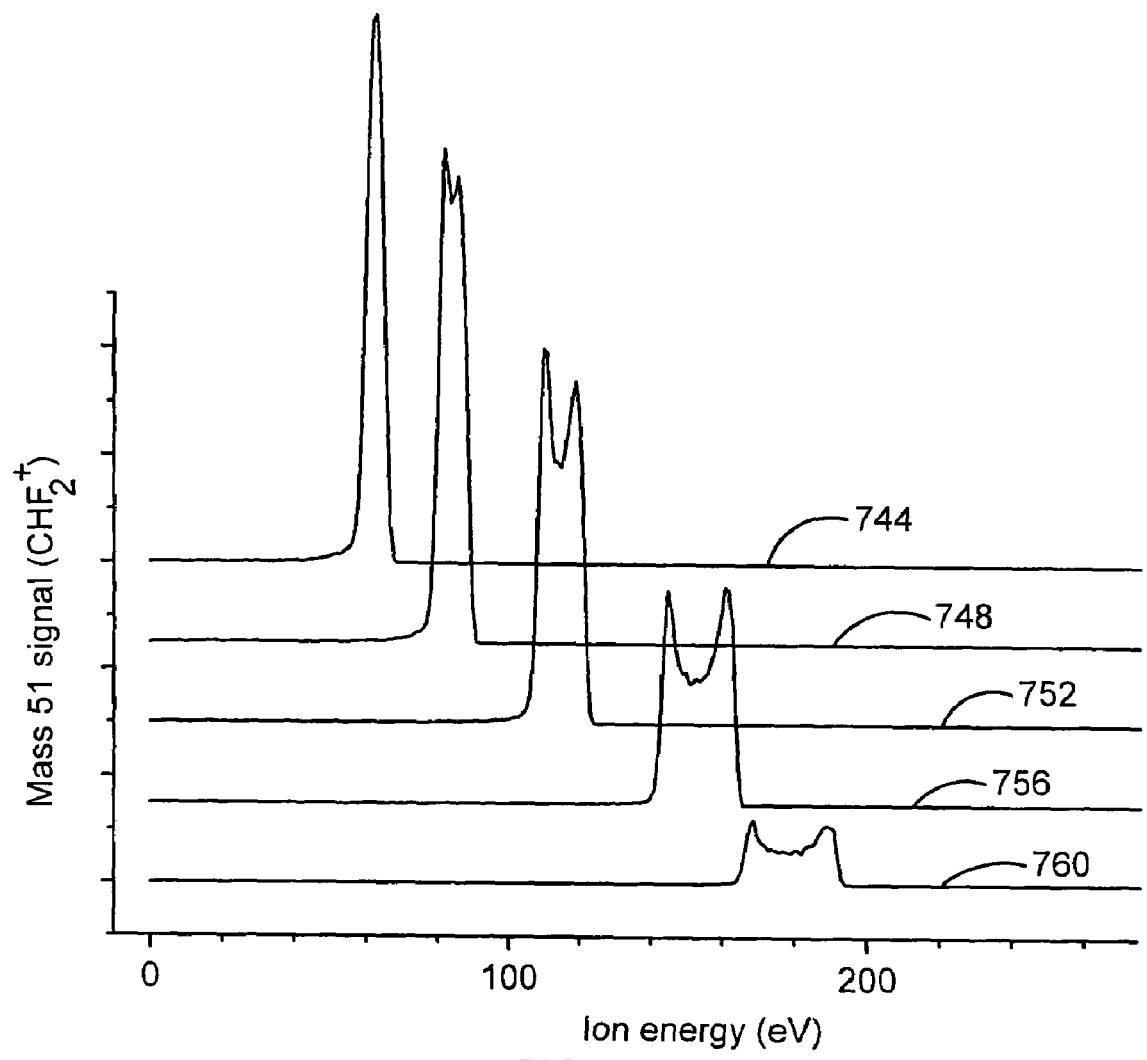

By comparison, FIG. 8B shows the variation of the ion energy and distribution of the same ion $CHF_2^+$ as a function of RF power for the same, higher frequency (60 MHz). The curve 744 shows ion energy and distribution for the ion $CHF_2^+$, when only 60 MHz signal is supplied to the plasma at the power level of 100 W. The curve 748 shows ion energy and distribution for the ion $CHF_2^+$, ion when 60 MHz signal is supplied at 200 Watts. The third curve 752 shows ion energy and distribution for the ion $CHF_2^+$, when the 60 MHz signal is supplied at 400 Watts. The fourth curve 756 shows ion energy and distribution for the ion $CHF_2^+$, when the 60 MHz signal is supplied at 800 Watts. The fifth curve 760 shows ion energy and distribution for the ion $CHF_2^+$, when 60 MHz signal is supplied at 1100 Watts.

By comparing FIG. 8A and FIG. 8B, it is clear that specific ion energy levels (e.g. as low as 80 W) cannot be obtained with a specific RF frequency (e.g. 27 MHz), but they are accessible with the higher RF frequency (e.g. 60 MHz). Concluding, by varying the RF frequency and the power levels, not just the speciation in the plasma can be modified but also the ion energy and its distribution.

In the etching of a high aspect ratio feature, as the etch progresses, the invention optimizes different etching conditions (e.g. ion to neutrals ratio, ion energy distribution) along the etch. At the beginning of the HAR contact etching less aggressive etching conditions may be used. That will ensure a good PR selectivity, less PR faceting and as a consequence less bowing. This can be accomplished by using preferentially the higher frequency power (e.g. 60 MHz or even higher,) and having relative lower power levels for the lower frequencies(e.g. 27 and 2 MHz). Bow creation may be further avoided by using this etch until the etching passes the bow level. As the aspect ratio increases the ions to neutral ratio decreases and also a more pronounced ion energy dependence is expected to be seen. Therefore more higher energy ions are required to be able to continue the etch. This can be accomplished by using preferentially 27 and 2 MHz at different power levels toward the end of the etch process. This may be accomplished by increasing power from the 27 and/or 2 MHz RF sources and possibly decreasing the power from the 60 MHz power source. Increasing the power from the 27 MH RF source may also increase mask selectivity, which is very helpful when high aspect ratio contacts are to be etched.

It has been further found that to reduce bowing the right amount of selectivity is needed. Too much or too little selectivity may increase bowing.

An etchant gas that may be used in embodiments of the invention may have a fluorocarbon or hydrofluorocarbon component. An inert gas such as argon and/or xenon and/or any other inert gas may be added as a component of the etchant gas. Oxygen may be another component of the etchant gas.

Preferably, the layer to be etched is a dielectric layer. More preferably, the layer to be etched is a silicon oxide layer. Preferably, the layer to be etched is a single layer. More preferably, the layer to be etched is a single uniform layer.

EXAMPLE

Example 1

In this example a contact is etched in oxide using a basic $C_4F_8$ chemistry.

The etch used an etch gas of 250 sccm Ar, 28 sccm $C_4F_8$, and 10 sccm of $O_2$, which is flowed into the chamber. Chamber pressure is set to 50 mTorr. A first RF power source provides a first RF signal of 2 MHz frequency. A second power source provides a second RF signal of 27 MHz frequency. A third power source provides a third RF signal of 60 MHz frequency.

In a first etch step the first power source provides 2000 Watts at 2 MHz, the second power source provides 0 Watts at 27 MHz, and the third power source provides 1000 Watts at 60 MHz. This step is provided for 120 seconds.

In a second etch step, the first power source provides 1400 Watts at 2 MHz, the second power source provides 1400 Watts at 27 MHz, and the third power source provides 200 Watts at 60 MHz. This step is provided for 120 seconds.

The resulting feature has a depth of 3.0 μm and a top CD of 0.18 μm: Therefore, the aspect ratio of the feature is 3.0/0.18, which is approximately 16.7.

Example 2

In this example a contact is etched in oxide using a basic $C_4F_6$ chemistry.

The etch used an etch gas of 400 sccm Ar, 30 sccm $C_4F_6$, and 24 sccm of $O_2$, which is flowed into the chamber. Chamber pressure is set to 35 mTorr. A first RF power source provides a first RF signal of 2 MHz frequency. A second power source provides a second RF signal of 27 MHz frequency. A third power source provides a third RF signal of 60 MHz frequency.

In a first etch step, the first power source provides 2000 Watts at 2 MHz, the second power source provides 200 Watts at 27 MHz, and the third power source provides 1000 Watts at 60 MHz. This step is provided for 100 seconds.

In a second etch step, the first power source provides 2000 Watts at 2 MHz, the second power source provides 600 Watts at 27 MHz, and the third power source provides 600 Watts at 60 MHz. This step is provided for 100 seconds.

In a third etch step, the first power source provides 1400 Watts at 2 MHz, the second power source provides 1500 Watts at 27 MHz, and the third power source provides 100 Watts at 60 MHz. This step is provided for 80 seconds.

The resulting feature has a depth of 2.6 μm and a top CD of 0.16 μm: Therefore, the aspect ratio of the feature is 2.6/0.16, which is 16.25.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for etching a high aspect ratio feature through a mask into a layer to be etched over a substrate, comprising:
    placing the substrate in a process chamber, which is able to provide RF power at a first frequency, a second frequency different than the first frequency, and a third frequency different than the first and second frequency;
    providing an etchant gas to the process chamber;
    providing a first etch step where the first frequency is at a first power level, the second frequency is at a second power level, and the third frequency is at a third power level, wherein the first power and at least one of the second or the third power are greater than zero, wherein the first etch etches a feature in the layer to be etched to a first depth; and
    providing a second etch step where the first frequency is at a fourth power level, the second frequency is at a fifth power level, and the third frequency is at a sixth power level, wherein at least one of the fourth and sixth powers is greater than zero and the fifth power is greater than zero, and wherein a condition is selected from the group of the first power not being equal to the fourth power and the third power not being equal to the sixth power, wherein the second etch etches the feature in the layer to be etched to a second depth greater than the first depth.

2. The method, as recited in claim 1, wherein the layer to be etched is a dielectric layer.

3. The method, as recited in claim 2, wherein the dielectric layer is a single layer.

4. The method, as recited in claim 3, wherein the single layer is a uniform layer.

5. The method, as recited in claim 4, further comprising a third etch step, wherein at least two of the seventh, eighth, and ninth powers is greater than zero and where a condition is selected from the group of the seventh power not being equal to the fourth power, the eighth power not being equal to the fifth power, and the ninth power not being equal to the sixth power, wherein the third etch etches the feature in the dielectric layer to a third depth greater than the second depth.

6. The method, as recited in claim 5, wherein the first frequency is between 100 kHz and 10 MHz, the second frequency is between 10 MHz to about 35 MHz, and the third frequency is greater than 40 MHz.

7. The method, as recited in claim 5, wherein the first frequency is about 2 MHz, the second frequency is about 27 MHz, and the third frequency is about 60 MHz.

8. The method, as recited in claim 5, wherein the etchant gas comprises a component gas selected from the group of a fluorocarbon and a hydrofluorocarbon.

9. The method, as recited in claim 1, further comprising a third etch step, wherein at least two of the seventh, eighth, and ninth powers is greater than zero and where a condition is selected from the group of the seventh power not being equal to the fourth power, the eighth power not being equal to the fifth power, and the ninth power not being equal to the sixth power, wherein the third etch etches the feature in the dielectric layer to a third depth greater than the second depth.

10. The method, as recited in claim 9, wherein the first frequency is between 100 kHz and 10 MHz, the second frequency is between 10 MHz to about 35 MHz, and the third frequency is greater than 40 MHz.

11. A method for etching a high aspect ratio feature in a dielectric layer over a substrate, comprising:
    placing the substrate in a process chamber, which is able to provide RF power at a first frequency, a second frequency different than the first frequency, and a third frequency different than the first and second frequencies;
    providing an etchant gas to the process chamber;
    providing a first etch step using the first frequency, the second frequency, and the third frequency to etch a feature into the etch layer to a first depth;
    providing a second etch using the first frequency, the second frequency, and the third frequency, with at least one of the frequencies at a different power level than that used in the first etch to etch the feature in the etch layer to a second depth greater than the first depth; and
    providing a third etch using the first frequency, the second frequency, and the third frequency, with at least one of the frequencies at a different power level than that used in the second etch, to etch the feature into the etch layer to a third depth greater than the second depth.

12. The method, as recited in claim 11, wherein the layer to be etched is a dielectric layer.

13. The method, as recited in claim 12, wherein the dielectric layer is a single layer.

14. The method, as recited in claim 13, wherein the single layer is a uniform layer.

15. The method, as recited in claim 11, wherein the first frequency is between 100 kHz and 10 MHz, the second frequency is between 10 MHz to about 35 MHz, and the third frequency is greater than 40 MHz.

* * * * *